United States Patent
Chen et al.

(10) Patent No.: US 10,217,895 B2
(45) Date of Patent: Feb. 26, 2019

(54) METHOD OF FORMING A LIGHT-EMITTING DEVICE

(71) Applicant: EPISTAR CORPORATION, Hsinchu (TW)

(72) Inventors: Chih-hao Chen, Hsinchu (TW); Yi-Lun Chou, Hsinchu (TW); Wei-Chih Peng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/630,660

(22) Filed: Jun. 22, 2017

(65) Prior Publication Data

US 2018/0374985 A1    Dec. 27, 2018

(51) Int. Cl.
*H01L 33/00*    (2010.01)
*H01L 33/10*    (2010.01)

(52) U.S. Cl.
CPC ........ *H01L 33/0075* (2013.01); *H01L 33/007* (2013.01); *H01L 33/10* (2013.01)

(58) Field of Classification Search
None
See application file for complete search history.

(56) References Cited

U.S. PATENT DOCUMENTS

| | | | |
|---|---|---|---|
| 5,977,612 A * | 11/1999 | Bour | B82Y 20/00 257/103 |
| 8,110,425 B2 * | 2/2012 | Yun | H01L 33/0075 257/E33.008 |
| 8,815,622 B2 * | 8/2014 | Yun | H01L 33/0075 257/E33.008 |
| 8,994,001 B2 | 3/2015 | Son | |
| 9,490,389 B2 * | 11/2016 | Gomez-Iglesias | H01L 33/0079 |
| 2006/0270075 A1 | 11/2006 | Leem | |
| 2011/0133242 A1 * | 6/2011 | Choi | H01L 33/38 257/99 |

(Continued)

FOREIGN PATENT DOCUMENTS

WO    2016004374 A1    1/2016

OTHER PUBLICATIONS

Suzuki, Takanobu, et al. "Optical Constants of Cubic GaN, AlN, and AlGaN Alloys." Japanese Journal of Applied Physics, vol. 39, No. Part 2, No. 6A, Jan. 2000, doi:10.1143/jjap.39.l497.*

(Continued)

*Primary Examiner* — Joseph Schoenholtz
(74) *Attorney, Agent, or Firm* — Patterson + Sheridan, LLP

(57) ABSTRACT

The present disclosure provides a method of forming a light-emitting device comprising: providing a growth substrate having a front side and a rear side; forming a sacrificial layer on the front side of the growth substrate; forming a protective structure on the sacrificial layer; forming a light-emitting structure on the protective structure, wherein the light-emitting structure emits a first peak wavelength; providing a carrier; joining the carrier and the light-emitting structure; and transforming the sacrificial layer by irradiating a laser beam from the rear side to separate the growth substrate from the light-emitting structure, wherein the laser beam emits a second peak wavelength, and wherein the protective structure reflects the second peak wavelength away from the light-emitting structure.

17 Claims, 11 Drawing Sheets

(56) References Cited

U.S. PATENT DOCUMENTS

| | | | | |
|---|---|---|---|---|
| 2013/0337599 | A1* | 12/2013 | Yun | H01L 33/0079 |
| | | | | 438/47 |
| 2015/0043606 | A1* | 2/2015 | Hamaguchi | H01S 5/0425 |
| | | | | 372/50.11 |
| 2015/0303655 | A1* | 10/2015 | Han | H01S 5/34333 |
| | | | | 372/45.012 |
| 2016/0035935 | A1* | 2/2016 | Han | H01L 21/02458 |
| | | | | 257/13 |
| 2016/0079468 | A1* | 3/2016 | Gomez-Iglesias | |
| | | | | H01L 33/0079 |
| | | | | 438/29 |

OTHER PUBLICATIONS

Doan, D., Nozaki, S., Uchida, K., Development of Laser Lift-Off Process with a GaN/Al0.7Ga0.3N Strained-Layer Superlattice for Vertical UVC LED Fabrication, International Journal of Engineering and Applied Sciences (IJEAS), vol. 4, Issue 4., pp. 51-56, Apr. 2017.*

Takeuchi, Misaichi, et al. "AlN/AlGaN Short-Period Superlattice Sacrificial Layers in Laser Lift-off for Vertical-Type AlGaN-Based Deep Ultraviolet Light Emitting Diodes." Applied Physics Letters, vol. 94, No. 6, 2009, p. 061117., doi:10.1063/1.3081060.*

Doan, David Trung. "Study of MOVPE Growth and Laser Lift-Off Process for Fabrication of III-Nitride Vertical UVC LED." Tokyo Japan, The University of Electro-Communications, Sep. 2017.*

* cited by examiner

METHOD OF FORMING A LIGHT-EMITTING DEVICE

TECHNICAL FIELD

The present disclosure relates to a light-emitting device and a manufacturing method thereof, more particularly, to a light-emitting device with a protective structure and a manufacturing method thereof.

DESCRIPTION OF BACKGROUND ART

The light radiation theory of light-emitting diode (LED) is when a suitable voltage is applied to the LED, electrons are able to recombine with holes within the LED, releasing energy in the form of photons. Because the light radiation theory of LEDs is different from conventional light source such as the incandescent light which is through the heating of filament, the LED is also called a "cold" light source. Moreover, LED has the advantages of good environment tolerance, a long service life, and low power consumption so it is regarded as another option to replace the conventional light source. Particularly, the application of the UV LED has been used in UV curing, medical phototherapy, counterfeit detection, disinfection/purification, and light sources of phosphor-conversion white LEDs.

An LED has a light-emitting stack which is epitaxially grown on a growth substrate. The growth substrate can be removed via a laser lift-off process and replaced by a permanent substrate via a bonding process to form a bonding-type LED. The permanent substrate has a higher heat dissipating efficiency than the growth substrate. The laser lift-off process is accomplished by irradiating the light-emitting stack through the growth substrate with a laser. However, if the power of the laser is not controlled under an optimized condition while performing substrate removing, the laser beam may damage the light-emitting stack of the LED.

SUMMARY OF THE DISCLOSURE

A method of forming a light-emitting device includes providing a growth substrate having a front side and a rear side; forming a sacrificial layer on the front side of the growth substrate; forming a protective structure on the sacrificial layer; forming a light-emitting structure on the protective structure, wherein the light-emitting structure emits a first peak wavelength; providing a carrier; joining the carrier and the light-emitting structure; and transforming the sacrificial layer by irradiating a laser beam from the rear side to separate the growth substrate from the light-emitting structure, wherein the laser beam emits a second peak wavelength, and wherein the protective structure reflects the second peak wavelength away from the light-emitting structure.

DETAILED DESCRIPTION OF THE PRESENT DISCLOSURE

To better and concisely explain the disclosure, the same name or the same reference number given or appeared in different paragraphs or figures along the specification should has the same or equivalent meanings while it is once defined anywhere of the disclosure.

Figure 1:
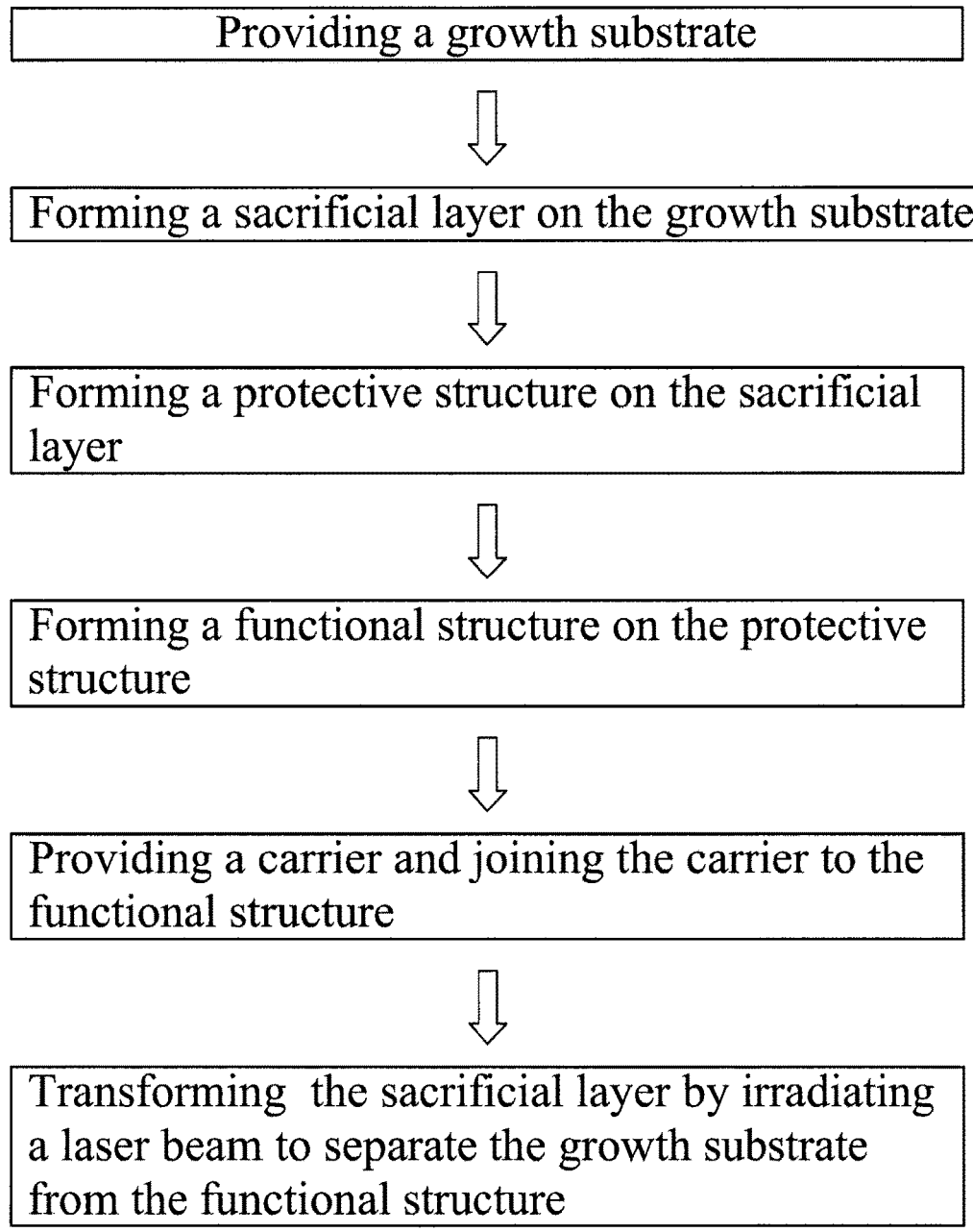
FIG. 1 shows a process flow of a method of manufacturing a semiconductor wafer in accordance with a first embodiment of the present disclosure.

FIG. 1 shows a process flow of a method for manufacturing a semiconductor wafer in accordance with a first embodiment of the present disclosure. The semiconductor wafer refers to a stack of semiconductor material used for the fabrication of a single or a plurality of semiconductor devices. A shape of the semiconductor wafer may include but not limited to circle or rectangular. As shown in FIG. 1, in the first embodiment, the steps of manufacturing the semiconductor wafer includes providing a growth substrate, forming a sacrificial layer on the growth substrate, forming a protective structure on the sacrificial layer, forming a functional structure on the protective structure; providing a carrier, joining the carrier and the functional structure, and transforming the sacrificial layer by a laser beam irradiating to separate the growth substrate from the functional structure. In one embodiment, the growth substrate includes a front side and a rear side, the sacrificial layer is formed on the front side and the laser beam irradiates from the rear side. In the embodiment, the functional structure is a light-emitting structure, emitting a first peak wavelength. In one embodiment, the laser beam can emit a second peak wavelength, and the protective structure can reflect the second peak wavelength away from the functional structure. In one embodiment, the semiconductor wafer includes a semiconductor epitaxial stack with the functional structure. The functional structure includes an optical-electronic structure, such as a light-emitting structure, or a solar power collecting structure, or an electronic structure, such as a power structure, for example a HEMT structure. The details of manufacturing steps are described as follows.

FIGS. 2A to 2D show manufacturing steps of a semiconductor wafer 1000' in accordance with a second embodiment of the present disclosure. The manufacturing steps of the semiconductor wafer 1000' in the embodiment includes the steps according to the process flow of the first embodiment of the present disclosure.

Figure 2A:
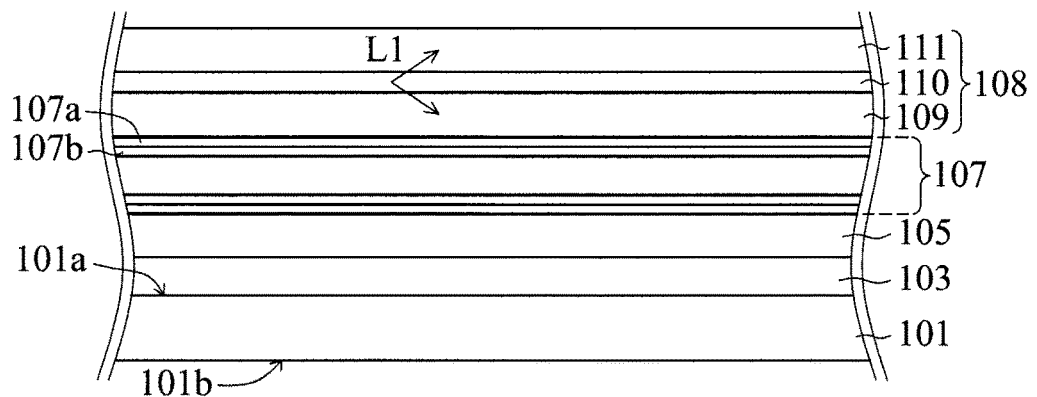
FIGS. 2A to 2D show cross-sectional views of a light-emitting device and manufacturing steps in accordance with a second embodiment of the present disclosure.
Figure 2B:
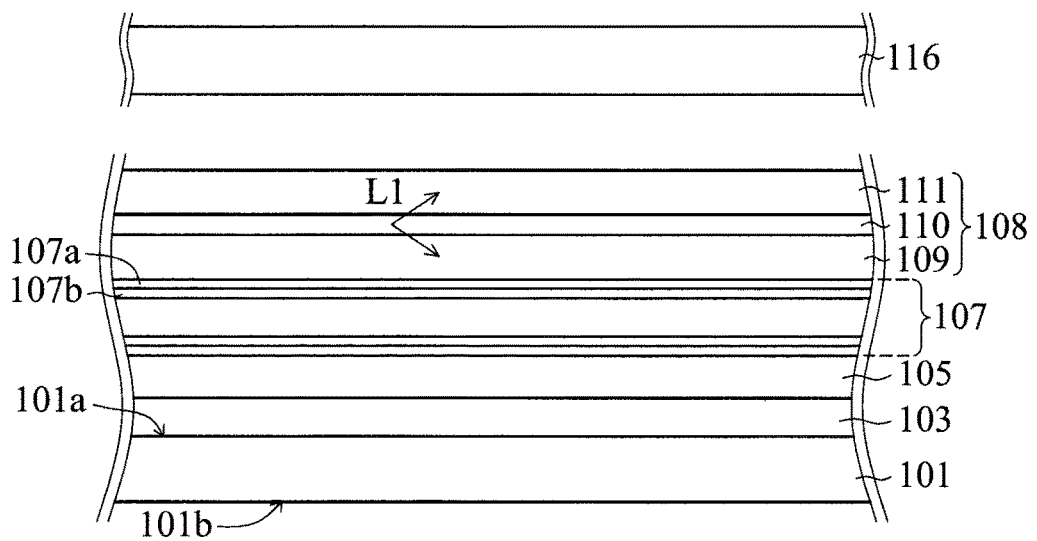
Figure 2C:
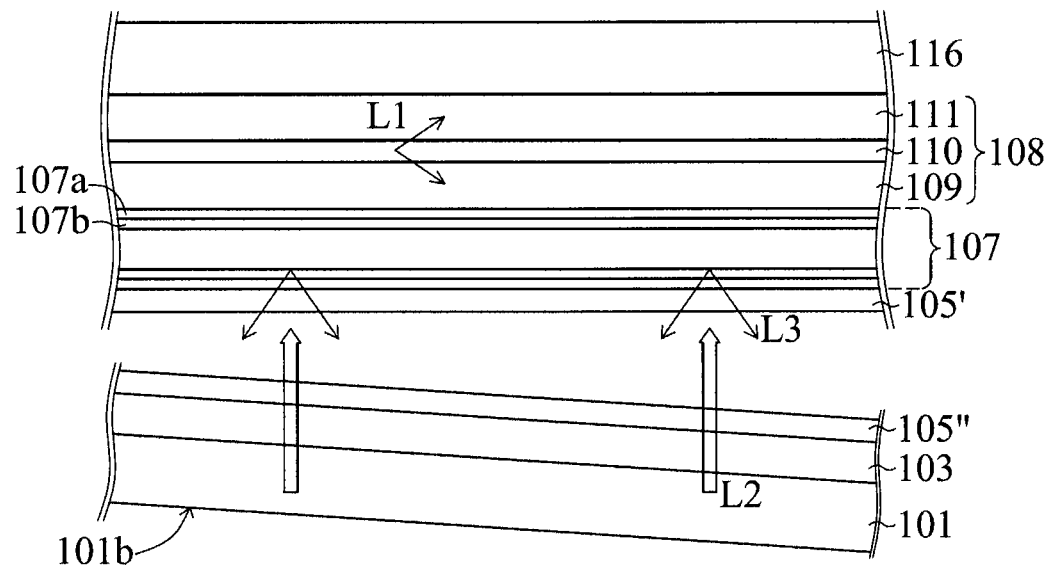
Figure 2D:
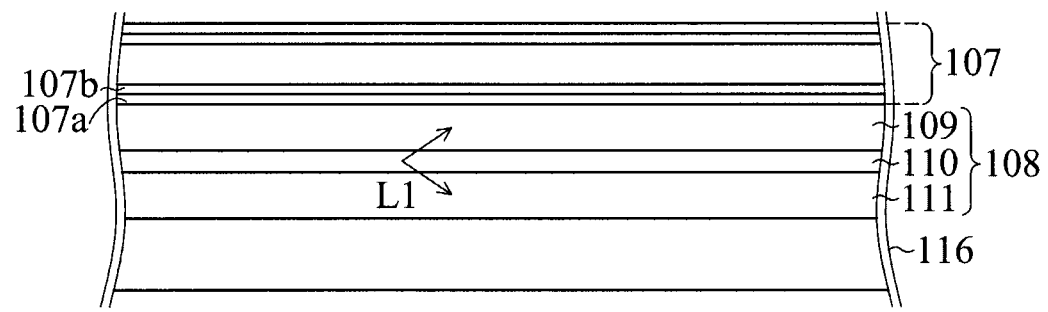

FIG. 2D is a cross sectional view of the semiconductor wafer 1000' in accordance with the second embodiment. The semiconductor wafer 1000' includes a carrier 116, a functional structure 108 formed on the carrier 116, a protective structure 107 formed on the functional structure 108. In the embodiment, the functional structure 108 is a light-emitting structure, emitting a first peak wavelength. The semiconductor wafer 1000' is a light-emitting wafer. The light-emitting structure 108 includes an n-type semiconductor layer 109, a p-type semiconductor layer 111, and an active layer 110 formed between the n-type semiconductor layer 109 and the p-type semiconductor layer 111.

As shown in FIG. 2A, a growth substrate 101 including a front side 101a and a rear side 101b is provided, and a buffer structure 103 is epitaxially formed on the front side 101a of the growth substrate 101. A sacrificial layer 105 is then formed on the buffer structure 103, and the protective structure 107 is formed on the sacrificial layer 105. Later on, the light-emitting structure 108 is formed on the protective structure 107 to form a semiconductor wafer 1000. In the embodiment, the semiconductor wafer 1000 is a light-emitting wafer. The light-emitting structure 108 includes the n-type semiconductor layer 109 formed on the protective structure 107, the active layer 110 formed on the n-type semiconductor layer 109, and the p-type semiconductor layer 111 formed on the active layer 110.

In one embodiment, the buffer structure 103 can reduce the dislocation and the lattice mismatch between the growth substrate 101 and the light-emitting structure 108.

In the present embodiment, the light-emitting structure 108 is capable of emitting a first light beam L1 including the first peak wavelength from the active layer 110.

In one embodiment, the first peak wavelength is between 400 nm and 570 nm which is the wavelength range of blue and green light, or between 570 nm and 1500 nm which is the wavelength range of red and infra-red light.

In the present embodiment, the first peak wavelength can be between 210 nm and 400 nm, for example 250 nm, which is the wavelength range of ultraviolet (UV) light.

After forming the semiconductor wafer 1000, as shown in FIG. 2B, the carrier 116 is provided and joined with the semiconductor wafer 1000.

In one embodiment, the carrier 116 is joined with the light-emitting structure 108 by bonding or depositing method. The bonding method includes metal bonding, dielectric bonding, glue bonding or semiconductor directly bonding. The depositing method includes directly forming the carries via epitaxially growth, sputtering or electrode-plating method. In the present embodiment, the carrier 116 is attached to the light-emitting structure 108 by metal bonding.

After joining the carrier 116 and the semiconductor wafer 1000, as shown in FIGS. 2C-2D, a second light beam L2 including a second peak wavelength generated from a laser machine (not shown) is applied. The second light beam L2 irradiates the semiconductor wafer 1000 through the rear side 101b of the growth substrate 101. The second light beam L2 passes through the growth substrate 101 and is focused in and absorbed by the sacrificial layer 105 in a depth from a top surface of the sacrificial layer 105 adjacent to the buffer structure 103. The second light beam L2 affects, transforms or changes the characteristics of the sacrificial layer 105, such as mechanical strength, transparency, or even state of the sacrificial layer 105.

In one embodiment, the second light beam L2 can affect the chemical bond strength between the material elements of the sacrificial layer 105 when the sacrificial layer 105 absorbs the energy of the second light beam L2. The chemical bonds will be weaker and weaker via the energy accumulation and then be broken. The material characteristics, such as composition or state of the sacrificial layer 105 are transformed or changed to other material characteristics.

In the present embodiment, a portion of the sacrificial layer 105 is melting or vaporizing into gas via absorbing the second light beam L2. The mechanical strength of the sacrificial layer 105 after absorbing the second light beam L2 is weaker than that before absorbing the second light beam L2, and then the growth substrate 101, the buffer structure 103, and a second portion of the sacrificial layer 105" is separated from the light-emitting structure 108, and the first portion of the sacrificial layer 105' is remained on the light-emitting structure 108. The semiconductor wafer 1000' is provided as shown in FIG. 2D.

In the present embodiment, the steps further include providing an etching process, such as wet etching or dry etching, to clean up the first portion of the sacrificial layer 105' and the protective structure 107 is exposed thereafter.

In the present embodiment, in order to control the yield rate and reliability of a laser lift-off process, the depth that the second light beam L2 focused in the sacrificial layer 105, and a thickness of the sacrificial layer 105 have to be adjusted. The depth and the thickness can be adjusted depending on whether the sacrificial layer 105 is formed on a flat type or a patterned type growth substrate.

In one embodiment, the depth is between 0.1 and 0.3 um when the sacrificial layer 105 is formed on the flat type growth substrate. The thickness of the sacrificial layer 105 can be between 1 um and 5 um. In one embodiment, the thickness of the sacrificial layer 105 can be between 1 um and 3 um when the sacrificial layer 105 is formed on the flat type growth substrate. In another embodiment, the thickness of the sacrificial layer 105 can be between 3 um and 5 um when the sacrificial layer 105 is formed on the patterned type growth substrate. In the present embodiment, the flat type growth substrate includes a flat surface for the buffer structure 103, the sacrificial layer 105, the protective structure 107 and the light-emitting structure 108 epitaxially growth; the patterned type growth substrate includes a patterned surface with a plurality of protrusions for epitaxially growth.

In the present embodiment, the second peak wavelength is shorter than that wavelength corresponding to the band gap of the sacrificial layer 105 and is larger than that wavelength corresponding to the band gap of the growth substrate 101 and the buffer structure 103. Therefore, the second light beam L2 is able to penetrate through the growth substrate 101 and the buffer structure 103, and to be absorbed by the sacrificial layer 105.

In one embodiment, the sacrificial layer 105 includes an absorbance of 90% or more in the second peak wavelength.

In one embodiment, the buffer structure 103 and the growth substrate 101 include a transmittance of 90% or more in the second peak wavelength. In the present embodiment, the second peak wavelength of the second light beam L2 is irradiated by a KrF laser which emits 248 nm wavelength, or an Nd:YAG laser which emits 355 nm wavelength. It is noted that the selected second peak wavelength of the second light beam L2 is relevant to the selected material of the buffer structure 103 and the growth substrate 101 which is transparent to the second light beam L2 and also the sacrificial layer 105 which is opaque to the second light beam L2 or can absorb the second light beam L2. For instance, if the buffer structure 103 or the growth substrate 101 includes $Al_kGa_{1-k}N$, k>0.6, a wavelength of the second light beam L2 for more than 253 nm is selected, and the second light beam L2 is able to penetrate the buffer structure 103 and the growth substrate 101, and to be absorbed by the sacrificial layer 105. On the other hand, if the buffer structure 103 or the growth substrate 101 includes $Al_kGa_{1-k}N$, k=1, a wavelength of the second light beam L2 for more than 197 nm is selected. Therefore, the selection of using KrF laser, Nd:YAG laser or other laser source will depend on the band gap of objects that is able to be penetrated by the laser beam, such as the growth substrate 101, the buffer structure 103, and absorbs the laser beam, such as the sacrificial layer 105 respectively.

In one embodiment, the growth substrate 101 is selected from a material which is transparent to the second light beam L2. The material of the growth substrate 101 includes insulative material, such as sapphire, diamond, glass, or quartz, or semiconductor material, such as Si, SiC, GaAs, ZnO, GaN, AlGaN or AlN.

In the present embodiment, the material of the growth substrate 101 includes AlN.

In one embodiment, the material of the growth substrate 101 includes sapphire. The sapphire has a band gap of 8.8 eV which equals to a wavelength of 141 nm. Therefore, the wavelength of the second light beam L2 of more than 141 nm can be selected.

In one embodiment, the buffer structure 103 is selected from a material which is opaque to the second light beam L2 or can absorb the second light beam L2. The material of the buffer structure 103 includes a semiconductor material selected from elements including Ga, Al, In, N, P, and As.

In one embodiment, the material of the buffer structure 103 includes $Al_zGa_{1-z}N$ ($0.6 \le z \le 1$). In the present embodiment, the material of the buffer structure 103 is AlN.

In one embodiment, the sacrificial layer 105 includes a semiconductor material selected from elements including Ga, Al, In, N, P, and As. In one embodiment, the material of the sacrificial layer 105 is $Al_wGa_{1-w}N$ ($0 \le w \le 0.6$) and can be a doped or an undoped material. In the present embodiment, the sacrificial layer includes $n-Al_{0.6}Ga_{0.4}N$.

As shown in FIG. 2C, in the present embodiment, a portion of the second light beam 12 is transmitted through the sacrificial layer 105 and a portion of the second light beam L2 passing through the sacrificial layer 105 is reflected as a reflected light beam 13 by the protective structure 107 away from the light-emitting structure 108 in order to protect the light-emitting structure 108 from being damaged by the second light beam L2 generated by the laser machine.

In one embodiment, the first peak wavelength of the first light beam L1 and the second peak wavelength of the second light beam L2 are different wavelength.

In the present embodiment, the protective structure 107 is a distributed Bragg reflector (DBR) structure including one or a plurality of semiconductor pairs composed by a first material layer 107a having a first refractive index and a second material layer 107b having a second refractive index, the first refractive index being greater than the second refractive index.

In one embodiment, the first refractive index is greater than the second refractive index.

In one embodiment, each of the first material layer 107a and the second material layer 107b has a thickness following an equation of $d=m(\lambda/4n)$, wherein d represents the thickness of the first or the second material layer 107a, 107b, $\lambda$ represents the wavelength of the light reflected by the DBR structure, n represents the refractive index of the first or the second material layer 107a, 107b, and m represents any positive integer.

In one embodiment, the first refractive index and the second refractive index are both between 2.0 and 2.5.

In one embodiment, the first material layer 107a is $Al_xGa_{1-x}N$ ($0.6 \le x \le 0.8$), and the first refractive index is between 2.35 and 2.45 corresponding to the second peak wavelength from the second light beam L2.

In one embodiment, the second material layer 107b is $Al_yGa_{1-y}N$ ($0.9 \le y \le 1$), and the second refractive index is between 2.15 and 2.35.

In the present embodiment, the first material layer 107a is $Al_{0.8}Ga_{0.2}N$) and the first refractive index is 2.35, the second material layer 107b is AlN, and the second refractive index is 2.15.

In one embodiment, a thickness of the protective structure 107 which reflects the second light beam 12 adapts according to the wavelength of the second light beam L2 in order to reflect the second light beam L2 away from the light-emitting structure 108. In one embodiment, a thickness of the first material layer 107a is 20 nm-30 nm and a thickness of the second material layer 107b is 25 nm-30 nm.

In the present embodiment, the semiconductor pairs of the protective structure 107 include 10 to 40 pairs. Therefore, the DBR structure of the protective structure 107 is capable of reflecting the reflected light beam L3 passing through the portion of sacrificial layer 105 and away from the light-emitting structure 108.

In the present embodiment, the protective structure 107 includes a reflectivity of 90% or more in the second peak wavelength to well protect the light-emitting structure 108. In addition, the DBR structure of the protective structure 107 which made of the first material layer 107a of $Al_xGa_{1-x}N$ ($0.6 \le x \le 0.8$) and the second material layer 107b of $Al_yGa_{1-y}N$ ($0.9 \le y \le 1$) is treated as a stress adjustment structure between the growth substrate 101 and a material with high Al composition of the light-emitting structure 108, for instance, in one embodiment, the active layer 110 is AlGaN based material and the Al composition is more than 30%, the n-type semiconductor layer 109 is AlGaN based material and the Al composition is between 30% and 60%, or the p-type semiconductor layer 111 is AlGaN based material and the Al composition is between 30% and 60%.

In one embodiment, the protective structure 107 is deposited by the method including physical vapor deposition (PVD), chemical vapor deposition (CVD), atomic layer deposition (ALD) or the combination thereof. In the present embodiment, the protective structure 107 is epitaxially growth on the buffer structure 103 by CVD.

In the present embodiment, the light-emitting structure 108 includes a material selected from elements including Ga, Al, In, N, P, and As.

In one embodiment, the n-type semiconductor layer 109 is AlGaN based material, wherein the Al composition is between 30% and 60% and doped with Si. The p-type semiconductor layer 111 is AlGaN based material, wherein the Al composition is between 30% and 60% and doped with Mg or Boron, and the active layer 110 includes AlGaN based material and the Al composition of the AlGaN is more than 30%.

In the present embodiment, the n-type semiconductor layer 109 is $n-Al_{0.6}Ga_{0.4}N$, the p-type semiconductor layer 111 is $p-Al_{0.6}Ga_{0.4}N$, and the active layer 110 includes a multiple quantum well having one or a plurality of $Al_{0.45}Ga_{0.55}N$ barrier layers and one or a plurality of $Al_{0.35}Ga_{0.6}N$ well layers.

In one embodiment, a material of the carrier 116 includes a conductive material selected from Si, SiC, W, Cu, Mo, and the combination thereof. In the present embodiment, the material of the carrier 116 includes Si.

FIGS. 3A to 3K show a top view and manufacturing steps of a semiconductor device 3000 in accordance with a third embodiment of the present disclosure. The manufacturing steps of the semiconductor device 3000 in the embodiment includes the steps according to the process flow of the first embodiment of the present disclosure.

Figure 3A:
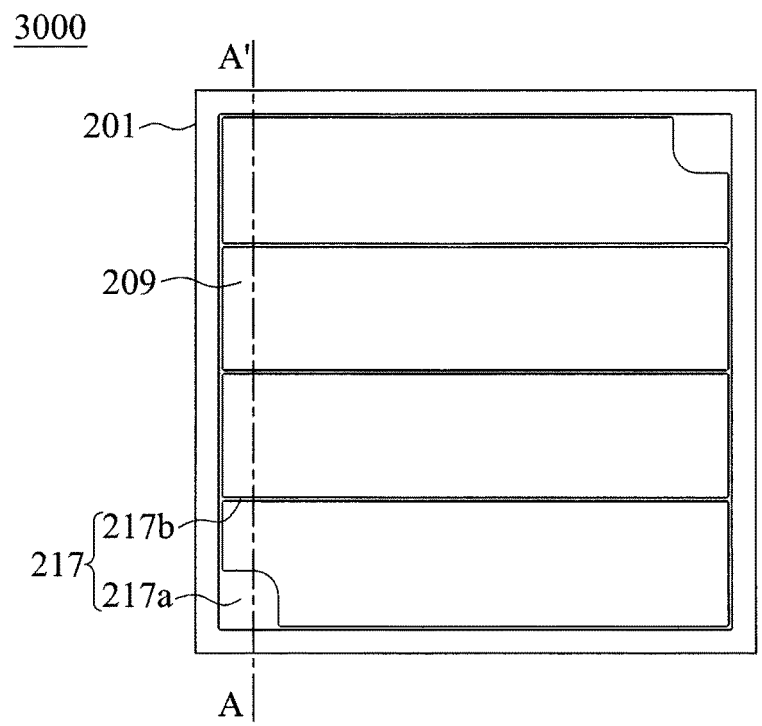
FIGS. 3A to 3K show a top view and cross-sectional views of a light-emitting device and manufacturing steps in accordance with a third embodiment of the present disclosure.

In the present embodiment, the semiconductor device 3000 is a light-emitting device. FIG. 3A shows the top view of the light-emitting device 3000. FIGS. 3B to 3K are the manufacturing steps in accordance with the third embodiment of the present disclosure. FIG. 3K is a cross sectional view of the light-emitting device 3000. Referring to FIGS. 3A, 3K, in the present embodiment, the light-emitting device 3000 includes a carrier 216, a second bonding layer 2152 formed on the carrier 216, a second eutectic layer 2142 formed on the second bonding layer 2152, a first eutectic layer 2141 formed on the second eutectic layer 2142, a first bonding layer 2151 formed on the first eutectic layer 2141, a current blocking layer 212 and a contact layer 213 formed on the first bonding layer 2151, a functional structure 208 formed on the current blocking layer 212 and the contact layer 213, a protective structure 207' formed on the functional structure 208, and a first electrode 217 formed on the protective structure 207'. The first electrode 217 includes an electrode pad 217a electrically connecting to a current supplier (not shown), and a extending portion 217b connecting the electrode pad 217a for current spreading.

In the present embodiment, the functional structure 208 is a light-emitting structure, emitting a first peak wavelength. The light-emitting structure 208 includes a p-type semiconductor layer 211 formed on the current blocking layer 212 and the contact layer 213, an active layer 210 formed on the p-type semiconductor layer 211, and a n-type semiconductor layer 209 formed on the active layer 210.

In one embodiment, the protective structure 207' functions as a reflector under the first electrode 217 to reflect the light beam L1 away from the first electrode 217 and prevent the first electrode 217 from absorbing the light beam L1. The light extraction efficiency is enhanced thereafter.

In one embodiment, the current blocking layer 212 is partially formed on the p-type semiconductor layer 211 and the contact layer 213 is formed on the p-type semiconductor layer 211 not covered by the current blocking layer 212. In one embodiment, the current blocking layer 212 is surrounded by the contact layer 213. In one embodiment the current blocking layer 212 is surrounded and covered by the contact layer 213.

In one embodiment, a passivation layer 221 is formed on an exposed surface 209' of the n-type semiconductor layer 209, a first sidewall 208' of the light-emitting structure 208, a second sidewall 207" of the protective structure 207', and a third sidewall 217' of the first electrode 217.

In one embodiment, a material of the carrier 216 includes a conductive material selected from Si, SiC, W, Cu, Mo, and the combination thereof. In the present embodiment, the material of the carrier 216 includes Si.

In one embodiment, a material of the first bonding layer 2151 and/or the second bonding layer 2152 includes a high melting point conductive material selected from Ni, Ti, Cu, Au, Pt, Rh, and the combination thereof. In one embodiment, the high melting point conductive material includes a metal material with melting point higher than 200° C. In the present embodiment, the material of the first bonding layer 2151 and/or the second bonding layer 2152 includes Au.

In one embodiment, a material of the first eutectic layer 2141 and/or the second eutectic layer 2142 includes a low melting point conductive material selected from Cd, Sn, In, and the combination thereof. In one embodiment, the low melting point conductive material includes a metal material with melting point lower than 200° C. In the present embodiment, the material of the first eutectic layer 2141 and/or the second eutectic layer 2142 includes In.

In one embodiment, a material of the current blocking layer 212 includes insulative material, such as $SiO_2$, $TiO_2$, SiN, or the combination thereof. In the present embodiment, the material of the current blocking layer 212 includes $TiO_2$.

In one embodiment, a material of the passivation layer 221 includes $Al_2O_3$, $SiO_2$, $TiO_2$, SiN, or the combination thereof. In the present embodiment, the material of the passivation layer 221 includes $SiO_2$.

In one embodiment, a material of the first electrode 217 includes a conductive material selected from Ti, Pt, Au, Cr, Al, or the combination thereof. In the present embodiment, the material of the first electrode 217 includes Au.

Figure 3B:
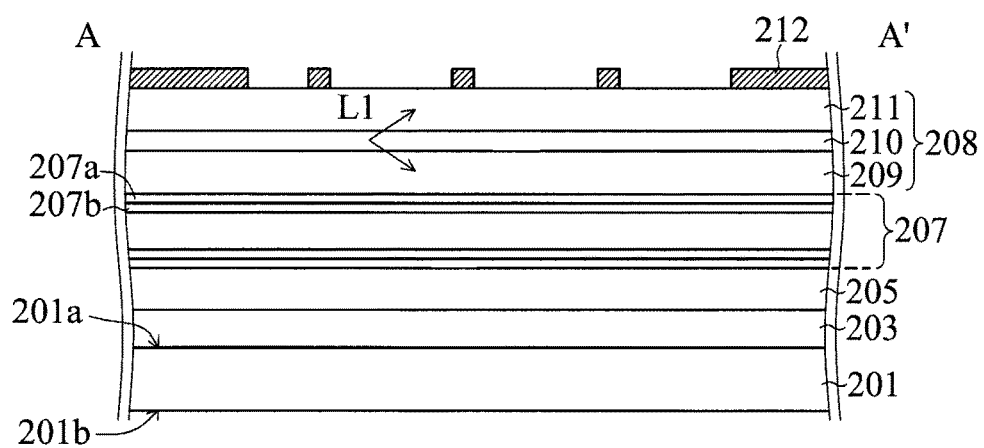

Similar to the steps of the manufacturing method in the second embodiment, as shown in FIG. 3B, a growth substrate 201 including a front side 201a and a rear side 201b is provided, and a buffer structure 203 is epitaxially formed on the front side 201a of the growth substrate 201 for reducing the dislocation and the lattice mismatch between the growth substrate 201 and the light-emitting structure 208. A sacrificial layer 205 is then formed on the buffer structure 203, and a protective structure 207 is formed on the sacrificial layer 205. Later on, the light-emitting structure 208 is formed on the protective structure 207. The light-emitting structure 208 includes the n-type semiconductor layer 209, the p-type semiconductor layer 211, and the active layer 210 formed between the n-type semiconductor layer 209 and the p-type semiconductor layer 211.

The light-emitting structure 208 is capable of emitting the first light beam L1 including the first peak wavelength from the active layer 210. In one embodiment, the first peak wavelength is between 400 nm and 570 nm which is the wavelength range of blue and green light, or between 570 nm and 1500 nm which is the wavelength range of red and infra-red light. In the present embodiment, the first peak wavelength can be between 210 nm and 400 nm, for example 250 nm, which is the wavelength range of ultraviolet (UV) light.

After that, the current blocking layer 212 is formed on the p-type semiconductor layer 211 of the light-emitting structure 208. In the present embodiment, the current blocking layer 212 is partially formed on the light-emitting structure 208 by a lithography process and an etching process and an exposed portion 208a of light-emitting structure 208 is not covered by the current blocking layer 212.

Figure 3C:
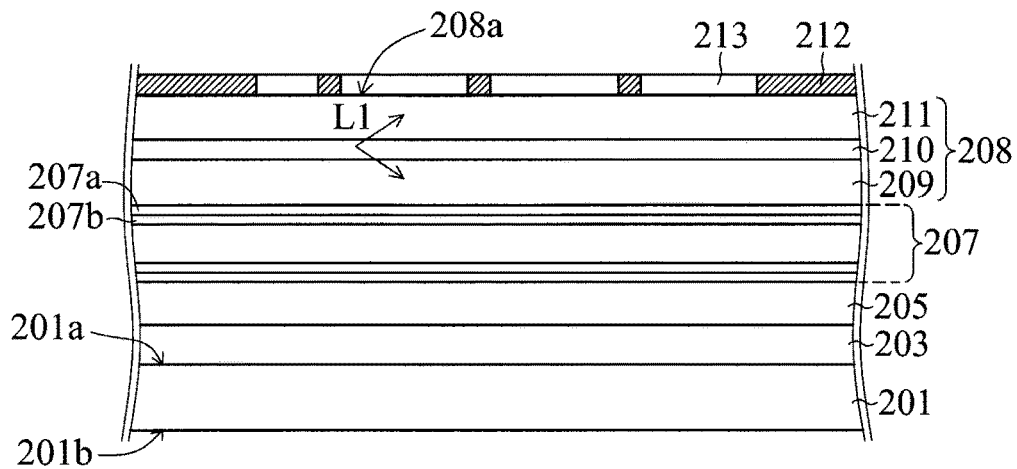

Furthermore, as shown in FIG. 3C, the contact layer 213 is then formed on the exposed portion 208a of light-emitting structure 208. In the present embodiment, the contact layer 213 is formed around the current blocking layer 212. In other embodiment, the contact layer 213 may cover at least a portion of current blocking layer 212.

Figure 3D:
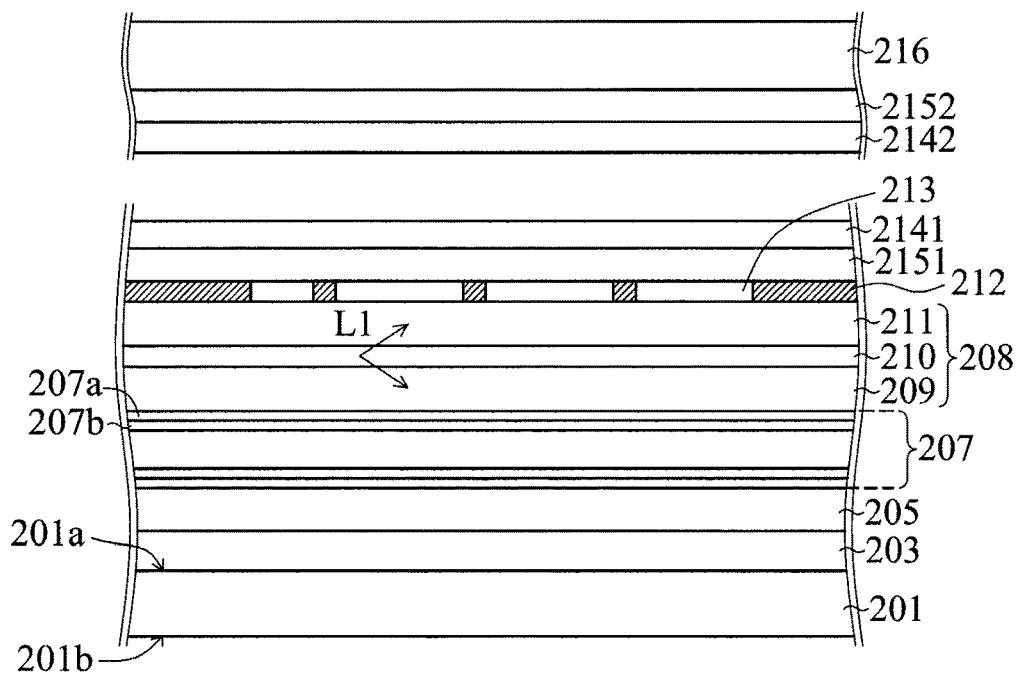

Then, as shown in FIG. 3D, the carrier 216 is provided and joined with the light-emitting structure 208. In one embodiment, the carrier 216 is joined with the light-emitting structure 208 by bonding or depositing method. In the present embodiment, the first bonding layer 2151, the first eutectic layer 2141, the second eutectic layer 2142, and the second bonding layer 2152 are used to join the carrier 216 with the light-emitting structure 208. The first bonding layer 2151 and the first eutectic layer 2141 is formed on the current blocking layer 212 and the contact layer 213. On the other hand, the carrier 216 is provided, and then the second bonding layer 2152 is formed on the carrier 216, the second eutectic layer 2142 is formed on the second bonding layer 2152. After that, the carrier 216 is attached to the light-emitting structure 208 by metal bonding through the first bonding layer 2151, the first eutectic layer 2141, the second eutectic layer 2142, and the second bonding layer 2152. In the present embodiment, the carrier 216 is a permanent substrate. In one embodiment, the first bonding layer 2151, the first eutectic layer 2141, the second eutectic layer 2142, and the second bonding layer 2152 form an eutectic by mutual diffusion thereof.

Figure 3E:
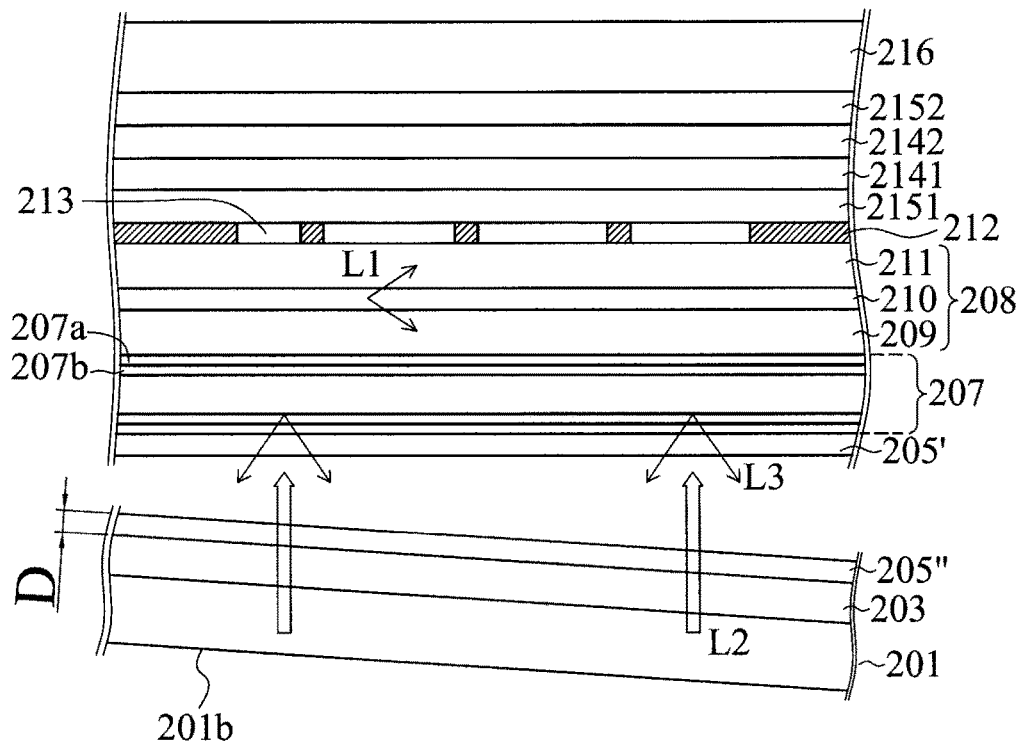

After joining the carrier 216 with the light-emitting structure 208, as shown in FIG. 3E, a second light beam L2 including the second peak wavelength generated from the laser machine (not shown) is applied and irradiates through the rear side 201b of the growth substrate 201, pass through the growth substrate 201 and is focused in the sacrificial layer 205. And then, the second light beam 12 focused in the sacrificial layer 205 is absorbed by the sacrificial layer 205 in a depth D from a top surface of the sacrificial layer 205 adjacent to the buffer structure 203.

In one embodiment, the depth D is between 0.1 and 0.3 um when the sacrificial layer 205 is formed on a flat type growth substrate. The second light beam L2 affects, transforms or changes the characteristics of the sacrificial layer 205, such as mechanical strength, transparency, or even state of the sacrificial layer 205. In one embodiment, the second light beam L2 can affect the chemical bond strength between the material elements of the sacrificial layer 205 when the sacrificial layer 205 absorbs the energy of the second light beam L2, and the chemical bonds are broken. The material characteristics, such as composition or state of the sacrificial layer 205 are transformed to other material characteristics and are changed.

In the present embodiment, a portion of the sacrificial layer 205 is melting or vaporizing into gas via absorbing the second light beam L2. The sacrificial layer 205 is separated into the first portion of the sacrificial layer 205' and the second portion of the sacrificial layer 205". And then the growth substrate 201, and the buffer structure 203 are separated from the light-emitting structure 208 through the first portion of the sacrificial layer 205' and the second portion of the sacrificial layer 205" separation.

In the present embodiment, in order to control the yield rate and reliability of lift-off process, a thickness of the sacrificial layer 205 can be between 1 um and 5 um, which depends on the design choice of a flat type or a patterned type growth substrate. The flat type growth substrate includes a flat surface for epitaxially growth; the patterned type growth substrate includes a patterned surface with a plurality of protrusions for epitaxially growth.

As shown in FIG. 3E, in the present embodiment, a portion of the second light beam L2 is transmitted through the sacrificial layer 205 and a portion of the second light beam L2 passing through the sacrificial layer 205 is reflected as a reflected light beam L3 by the protective structure 207 away from the light-emitting structure 208 in order to protect the light-emitting structure 208 from being damaged by the second light beam L2 generated by the laser machine.

In one embodiment, the first peak wavelength of the first light beam L1 and the second peak wavelength of the second light beam L2 are different wavelength.

In the present embodiment, the second wavelength is shorter than that wavelength corresponding to the band gap of the sacrificial layer 205 and is larger than that wavelength corresponding to the band gap of the growth substrate 201 and the buffer structure 203. Therefore, the second light beam L2 is able to pass through the growth substrate 201 and the buffer structure 203, and to be absorbed in the sacrificial layer 205.

In one embodiment, the sacrificial layer 205 includes an absorbance of 90% or more in the second peak wavelength.

In one embodiment, the buffer structure 203 and the growth substrate 201 include a transmittance of 90% or more in the second peak wavelength. In the present embodiment, the second peak wavelength of the second light beam L2 is irradiated by a KrF laser which emits 248 nm wavelength, or an Nd:YAG laser which emits 355 nm wavelength. It is noted that the selected second peak wavelength of the second light beam L2 is relevant to the selected material of the buffer structure 203 and the growth substrate 201 which is transparent to the second light beam L2. And the selected second peak wavelength of the second light beam L2 is also relevant to the sacrificial layer 105 which is opaque to the second light beam L2 or can absorb the second light beam L2. For instance, if the buffer structure 203 or the growth substrate 201 includes $Al_kGa_{1-k}N$, k>0.6, a wavelength of the second light beam L2 for more than 253 nm is selected, and the second light beam L2 is able to penetrate the buffer structure 203 and the growth substrate 201, and to be absorbed by the sacrificial layer 205. On the other hand, if the buffer structure 203 or the growth substrate 201 includes $Al_kGa_{1-k}N$, k=1, a wavelength of the second light beam L2 for more than 197 nm is selected. Therefore, the selection of using KrF laser, Nd:YAG laser or other laser source will depend on the band gap of objects that is able to be penetrated by the laser beam, such as the growth substrate 201, the buffer structure 203, and absorb the laser beam, such as the sacrificial layer 205 respectively.

In one embodiment, the material of the growth substrate 201 includes sapphire. The sapphire has a band gap of 8.8 eV which equals to a wavelength 141 nm. Therefore, the wavelength of the second light beam L2 of more than 141 nm can be selected.

In one embodiment, a material of the protective structure 207 which reflects the second peak wavelength of the second light beam L2 also needs to adapt according to the wavelength of the second light beam L2 simultaneously in order to reflect the second light beam L2 away from the light-emitting structure 208 and to protect the light-emitting structure 108 from being damaged by the second light beam L2.

Similar to the second embodiment, in the present embodiment, the protective structure 207 is a distributed Bragg reflector (DBR) structure including a first material layer 207a having a first refractive index and a second material layer 207b having a second refractive index, the first refractive index being greater than the second refractive index. In one embodiment, the DBR structure of the protective structure 207 includes a reflectivity of 99% or more in the second peak wavelength of the second light beam L2.

Figure 3F:
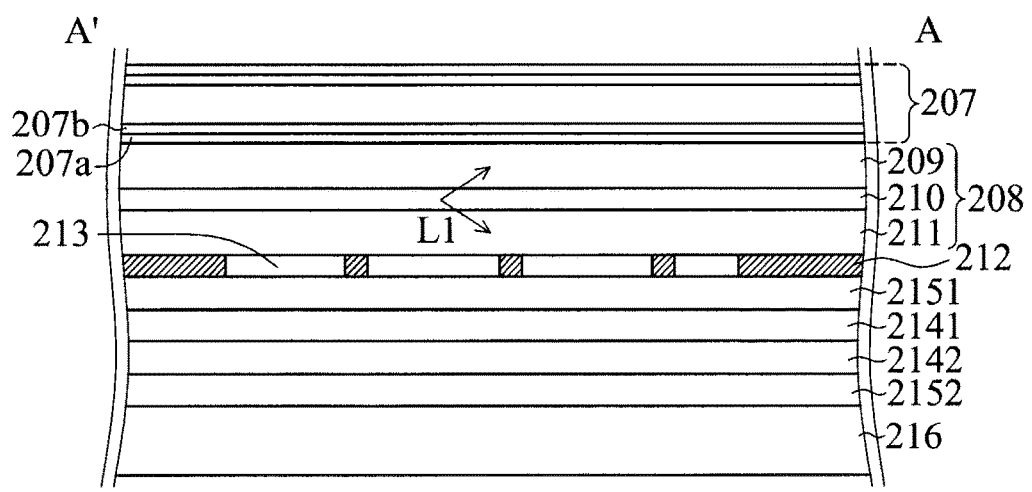

In the present embodiment, as shown in FIGS. 3E and 3F, the steps further include providing an etching process, such as wet etching or dry etching, to clean up the first portion of the sacrificial layer 205' and the protective structure 207 is exposed thereafter.

Figure 3G:
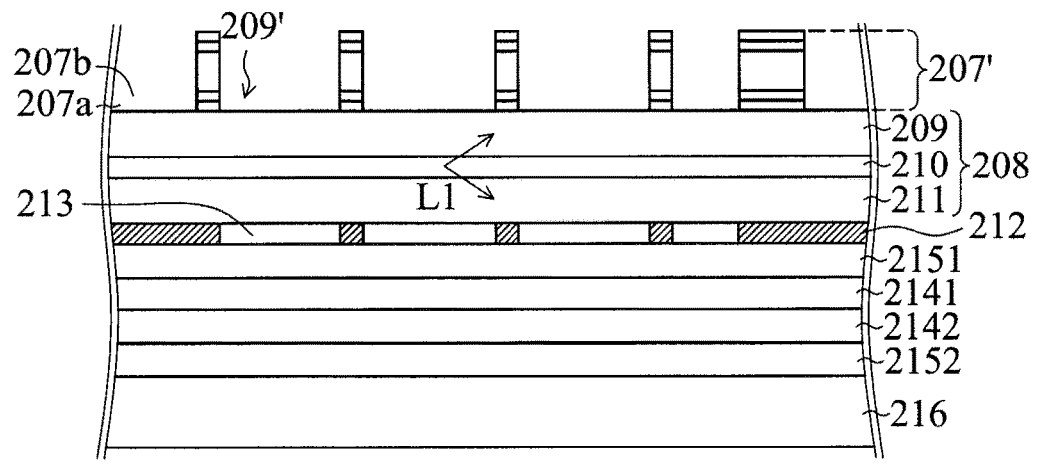

After that, as shown in FIG. 3G, a portion of the protective structure 207 is dry etched to expose an exposed surface 209' of the light-emitting structure 208 and an unremoved portion of the protective structure 207' is remained.

Figure 3H:
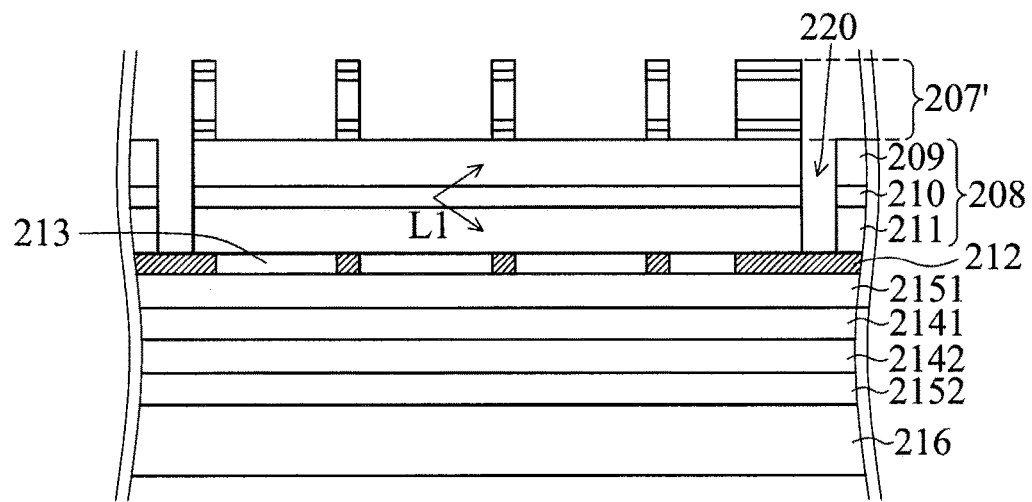

And then, an isolation process is provided, as shown in FIG. 3H. In the isolation process, a plurality of trenches 220 are formed by removing portions of the light-emitting structure 208, and then the current blocking layer 212 is exposed by the trenches 220. The method of forming the trenches 220 includes a dry etch process such as ICP etching, a wet etching process such as wet etching by a etchant of $H_3PO_4$, or the combination thereof. In one embodiment, the trenches 220 are formed as a dicing region. The dicing region is where a breaking force, such as laser or dicing saw, aligned thereon for dividing the wafer into the plurality of the light-emitting device 3000.

Figure 3I:
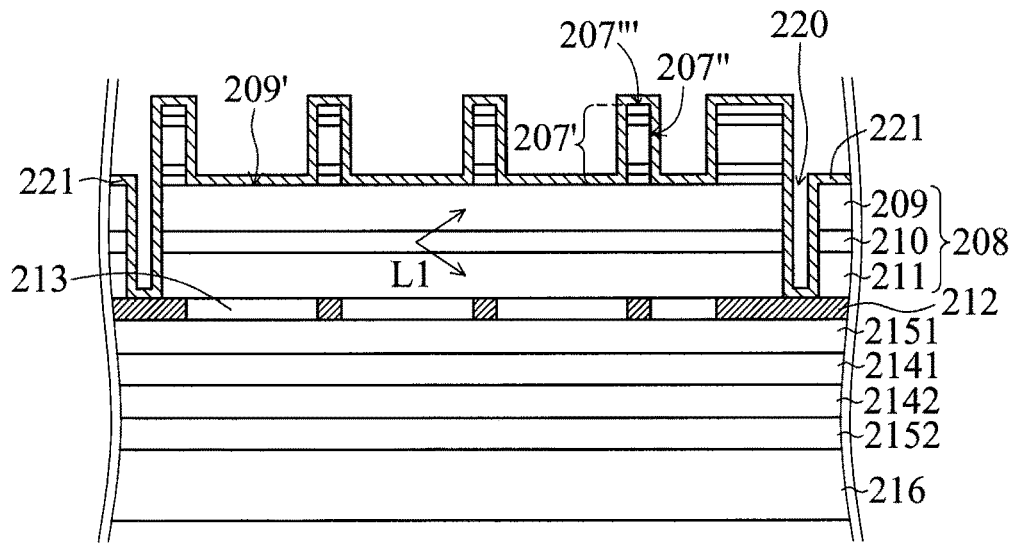

After that, as shown in FIG. 3I, a passivation layer 221 is formed conformably on the unremoved portion of protective structure 207', the trenches 220, and the exposed surface 209' of light-emitting structure 208.

Figure 3J:
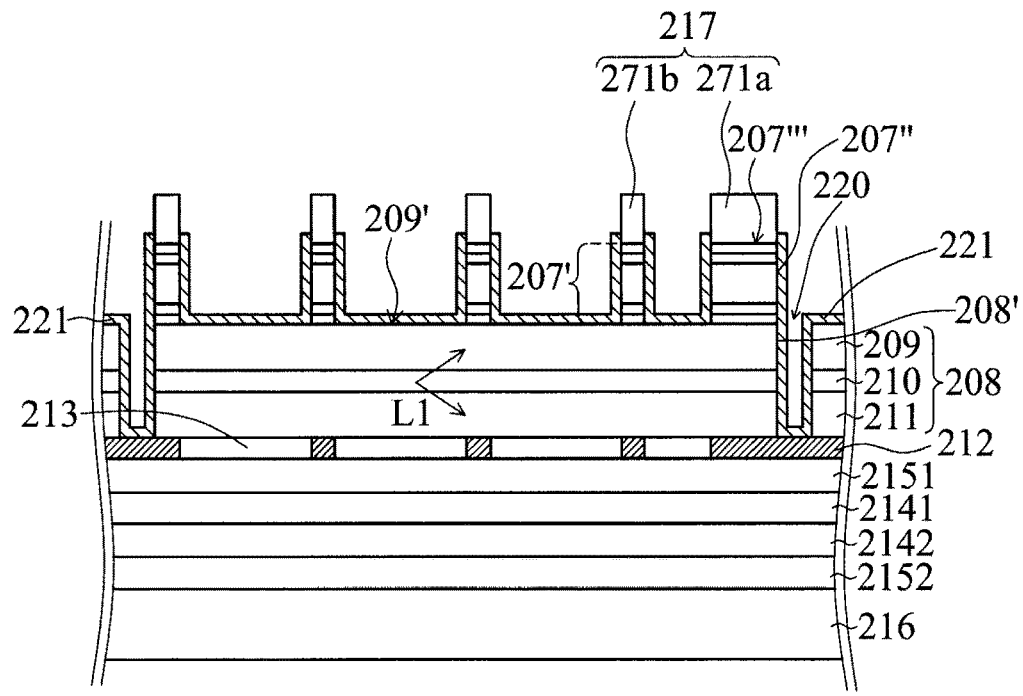
Figure 3K:
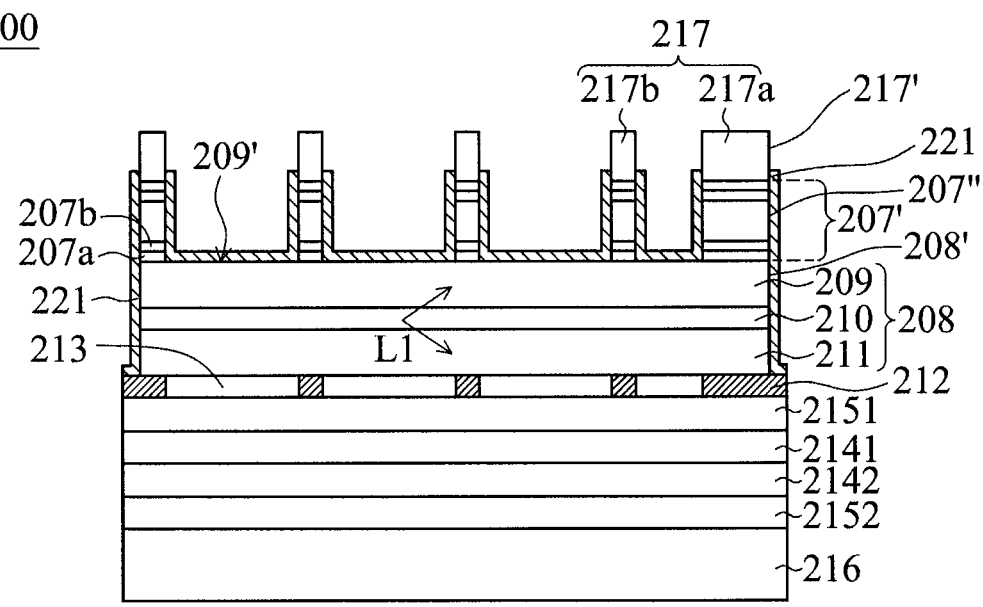

And then, an etching process is applied on a portion of the passivation layer 221 corresponding to the location of the unremoved portion of protective structure 207' so as to expose a top surface 207''' of the protective structure 207'. A first electrode 217 is then provided on the top surface 207''' of protective structure 207', as shown in FIG. 3J.

Finally, a dicing process is provided through the trenches 220 to divide the wafer into the plurality of light-emitting device 3000, as shown in FIG. 3K. In one embodiment, the dicing process includes applying the breaking force with a dicing saw (not shown) in a direction aligned with the dicing region which is the trenches 220 and cutting the current blocking layer 212, the first bonding layer 2151, the first eutectic layer 2141, the second eutectic layer 2142, the second bonding layer 2152, and the carrier 216 under the trenches 220 via the dicing saw. After the dicing process, the light-emitting device 3000 is formed as shown in FIG. 3K.

Figure 4A:
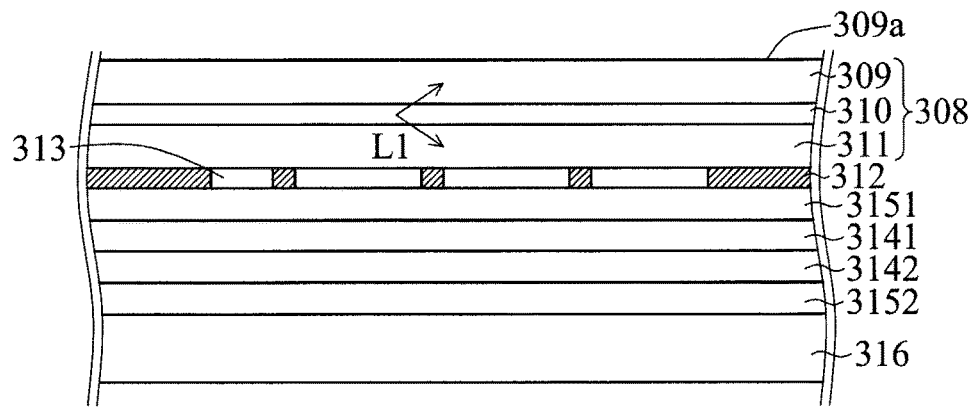
FIGS. 4A to 4F show cross-sectional views of a light-emitting device and manufacturing steps in accordance with a fourth embodiment of the present disclosure.
Figure 4B:
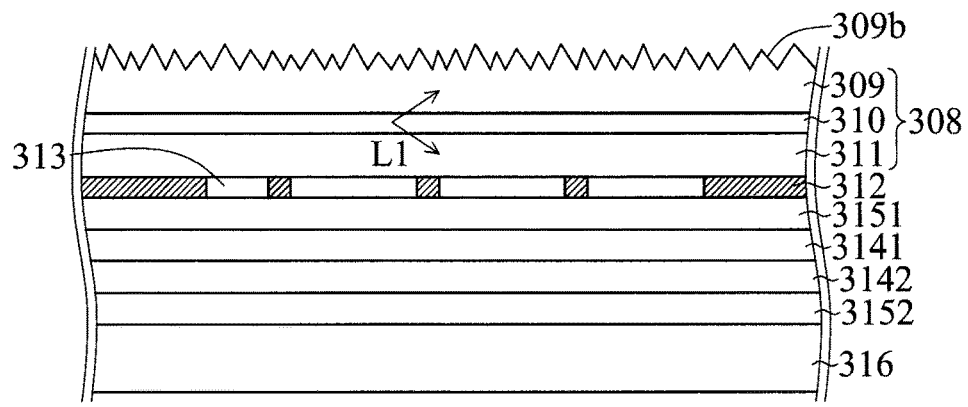
Figure 4C:
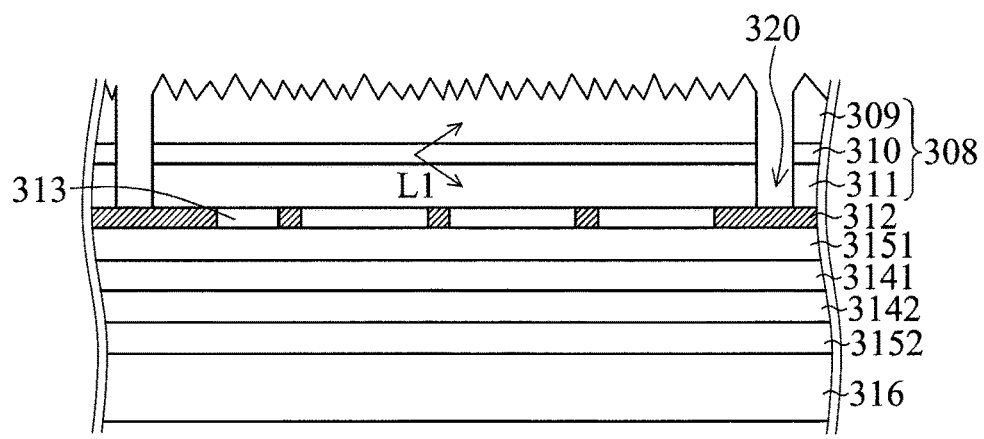
Figure 4D:
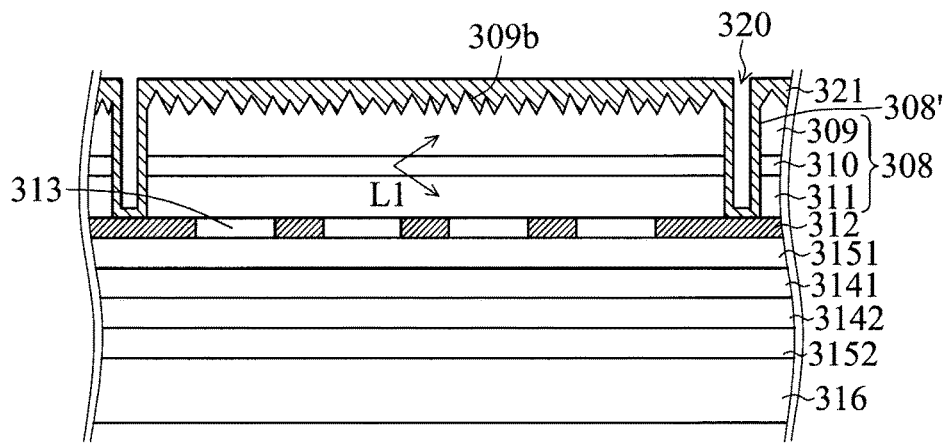
Figure 4E:
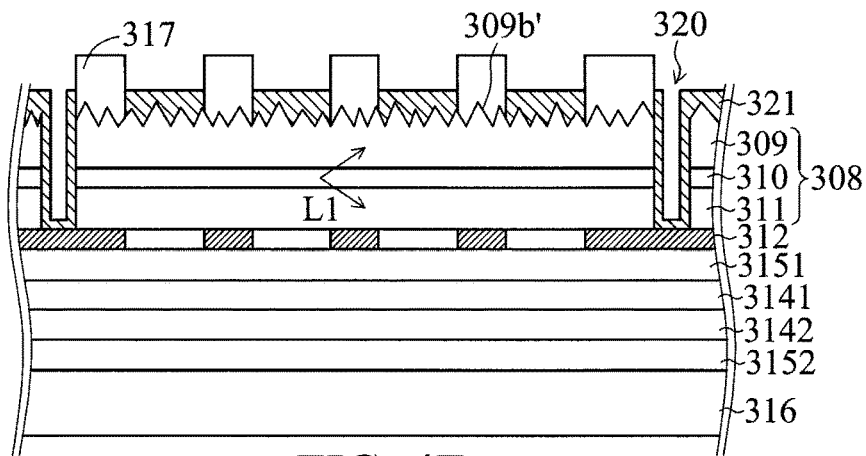
Figure 4F:
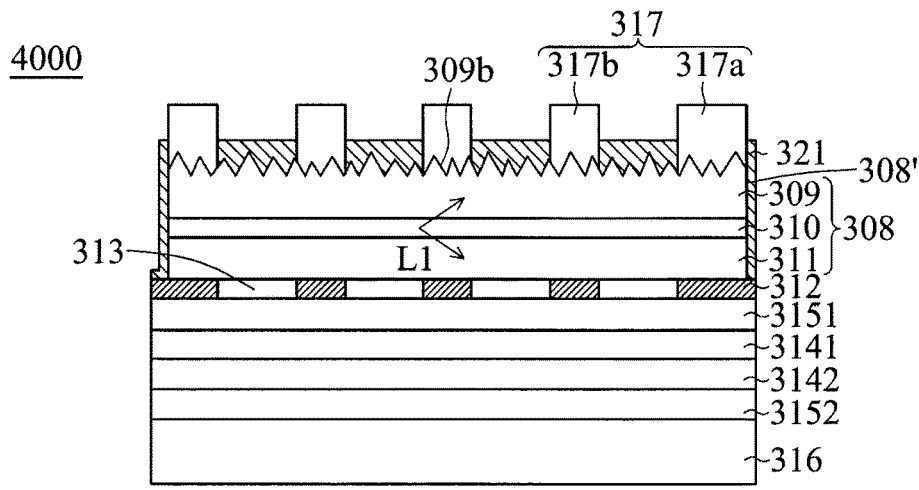

FIGS. 4A to 4F show manufacturing steps of a semiconductor device 4000 in accordance with the fourth embodiment of the present disclosure. The manufacturing steps of the semiconductor device 4000 in the embodiment includes the steps according to the process flow of the first embodiment of the present disclosure. FIG. 4F is a cross sectional view of the semiconductor device 4000 in accordance with the fourth embodiment.

In the present embodiment, the semiconductor device 4000 is a light-emitting device. The light-emitting device 4000 includes a carrier 316, a second bonding layer 3152 formed on the carrier 316, a second eutectic layer 3142 formed on the second bonding layer 3152, a first eutectic layer 3141 formed on the second eutectic layer 3142, a first bonding layer 3151 formed on the first eutectic layer 3141, a current blocking layer 312 and a contact layer 313 formed on the first eutectic layer 3141, a functional structure 308 formed on the current blocking layer 312 and the contact layer 313, and a first electrode 317 formed on the functional structure 308. The first electrode 317 includes an electrode pad 317a electrically connecting to a current supplier (not shown), and a extending portion 317b connecting the electrode pad 317a for current spreading.

In the present embodiment, the functional structure 308 is a light-emitting structure, emitting a first peak wavelength. The light-emitting structure 308 includes a p-type semiconductor layer 311 formed on the current blocking layer 312 and the contact layer 313, an active layer 310 formed on the p-type semiconductor layer 311, and a n-type semiconductor layer 309 formed on the active layer 310.

In one embodiment, the current blocking layer 312 is formed on the p-type semiconductor layer 311 and the contact layer 313 is formed on the p-type semiconductor layer 311 not covered by the current blocking layer 312. In one embodiment, the current blocking layer 312 is surrounded by the contact layer 313.

In one embodiment, the light-emitting structure 308 includes a first sidewall 308', and the n-type semiconductor layer 309 includes a roughness surface 309b. A passivation layer 321 is formed on the roughness surface 309b of the n-type semiconductor layer 309, and the first sidewall 308' of the light-emitting structure 308.

In one embodiment, a material of the carrier 316 includes a conductive material selected from Si, SiC, W, Cu, Mo, and the combination thereof. In the present embodiment, the material of the carrier 316 includes Si.

In one embodiment, a material of the first bonding layer 3151 and/or the second bonding layer 3152 includes a high melting point conductive material selected from Ni, Ti, Cu, Au, Pt, Rh, and the combination thereof. In the present embodiment, the material of the first bonding layer 3151 and/or the second bonding layer 3152 includes Au.

In one embodiment, a material of the first eutectic layer 3141 and/or the second eutectic layer 3142 includes a conductive material selected from Cd, Sn, In or the combination thereof. In the present embodiment, the material of the first eutectic layer 3141 and/or the second eutectic layer 3142 includes In.

In one embodiment, a material of the current blocking layer 312 includes insulative material, such as $SiO_2$, $TiO_2$, SiN, or the combination thereof. In the present embodiment, the material of the current blocking layer 312 includes $TiO_2$.

In one embodiment, a material of the passivation layer 321 includes $Al_2O_3$, $SiO_2$, $TiO_2$, SiN, or the combination thereof. In the present embodiment, the material of the passivation layer 321 includes $SiO_2$.

In one embodiment, a material of the first electrode 317 includes a conductive material selected from Ti, Pt, Au, Cr, and the combination thereof. In the present embodiment, the material of the first electrode 317 includes Au.

In the fourth embodiment, the steps before separating the growth substrate 201 from the light-emitting structure 208 are similar to that of the third embodiment. The difference between the third embodiment and fourth embodiment is after a growth substrate (not shown) is separated from the light-emitting structure 308 and a protective structure (not shown) is exposed, the protective structure is entirely removed by wet or dry etching, and the n-type semiconductor layer 309 of the light-emitting structure 308 is exposed entirely.

After that, a roughing process is applied on a top surface 309a of the n-type semiconductor layer 309 to create a regular or irregular roughened surface 309b, as shown in FIG. 4B. The roughing process includes dry etching or wet etching. In the present embodiment, the roughened surface 309b, is formed by wet etching by a etchant of KOH.

And then, an isolation process is provided to partially remove the light-emitting structure 308 and expose the current blocking layer 312 to form a dicing region, as shown in FIG. 4C. The dicing region is where a breaking force aligned thereon for dividing the wafer into the plurality of the light-emitting device 4000. The isolation process includes a dry etch process such as ICP etching, a wet etching process such as wet etching by a etchant of $H_3PO_4$, or the combination thereof. Trenches 320 are formed via the isolation process.

After that, as shown in FIG. 4D, the passivation layer 321 is conformably formed on the trenches 320, and the first sidewall 308' of the light-emitting structure 308.

And then, an etching process is applied on a portion of the passivation layer 321 corresponding to a location which vertically aligned with the current blocking layer 312, so as to expose a top portion 309b' of the roughened surface 309b. The first electrode 317 is then provided on the top portion 309b' of the n-type semiconductor layer 309, as shown in FIG. 4E.

Finally, a dicing process is provided through the trenches 320, which is the dicing region, to divide the wafer into the plurality of light-emitting device 4000, as shown in FIG. 4F. The dicing process includes applying a breaking force with a dicing saw through the trenches 320 and cutting the current blocking layer 312, the first bonding layer 3151, the first eutectic layer 3141, the second eutectic layer 3142, the second bonding layer 3152, and the carrier 316 via the dicing saw.

It should be noted that the proposed various embodiments are for explanation but not for the purpose to limit the scope of the disclosure. Any possible modifications without departing from the spirit of the disclosure may be made and should be covered by the disclosure. The similar or same elements or the elements with the same reference numeral in different embodiments have identical chemical or physical characters. Besides, the elements shown in different embodiments mentioned above could be combined or replaced with one another in proper situation. The connecting relationship of specific element particularly described in one embodiment could also be applied in another embodiment, and the subject matter which comprises the elements in different embodiments all fall within the scope of the following claims and their equivalents.

What is claimed is:

1. A method of forming a light-emitting device comprising:
    providing a growth substrate having a front side and a rear side;
    forming a sacrificial layer on the front side of the growth substrate;
    forming a protective structure on the sacrificial layer;
    forming a light-emitting structure on the protective structure, wherein the light-emitting structure emits a first peak wavelength;
    providing a carrier;
    joining the carrier and the light-emitting structure; and
    transforming the sacrificial layer by irradiating a laser beam from the rear side to separate the growth substrate from the light-emitting structure, wherein the laser beam emits a second peak wavelength, and wherein the protective structure reflects the second peak wavelength away from the light-emitting structure; wherein the protective structure comprises a first portion and a second portion, wherein the method further comprises removing the first portion, and forming an electrode on the second portion.

2. The method of forming the light-emitting device of claim 1, further comprising forming a buffer structure between the growth substrate and the sacrificial layer.

3. The method of forming the light-emitting device of claim 1, wherein the protective structure comprises a DBR structure, the DBR structure comprises a reflectivity of 99% or more in the second peak wavelength.

4. The method of forming the light-emitting device of claim 3, wherein the DBR structure comprises semiconductor pairs, each of the semiconductor pairs comprises a first material layer having a first refractive index and a second material layer having a second refractive index, the first refractive index being greater than the second refractive index.

5. The method of forming the light-emitting device of claim 4, wherein the first material layer comprises $Al_xGa_{1-x}N$ (0.6≤x≤0.8), and the second material layer comprises $Al_yGa_{1-y}N$ (0.9≤y≤1).

6. The method of forming the light-emitting device of claim 4, wherein the first refractive index and the second refractive index are between 2.0 and 2.5.

7. The method of forming the light-emitting device of claim 4, wherein a number of the semiconductor pairs is between 10 and 40.

8. The method of forming the light-emitting device of claim 1, wherein the laser beam is irradiated by a KrF laser or an Nd:YAG laser.

9. The method of forming the light-emitting device of claim 1, wherein the first peak wavelength and/or the second peak wavelength are between 210 and 400 nm, the first peak wavelength are different from the second peak wavelength.

10. The method of forming the light-emitting device of claim 2, wherein the buffer layer comprises $Al_zGa_{1-z}N$ (0.6≤z≤1).

11. The method of forming the light-emitting device of claim 1, wherein the sacrificial layer comprises $Al_wGa_{1-w}N$ (0≤w≤0.6).

12. The method of forming the light-emitting device of claim 1, wherein the substrate comprises AlN or sapphire.

13. The method of forming the light-emitting device of claim 1, wherein the sacrificial layer comprises an absorbance of 90% or more in the second peak wavelength.

14. The method of forming the light-emitting device of claim 2, wherein the buffer structure comprises a transmittance of 90% or more in the second peak wavelength.

15. The method of forming the light-emitting device of claim 1, wherein the growth substrate comprises a transmittance of 90% or more in the second peak wavelength.

16. The method of forming the light-emitting device of claim 1, further comprising providing a bonding layer between the carrier and the light-emitting structure, wherein the carrier and the bonding layer are conductive material.

17. The method of forming the light-emitting device of claim 1, further comprising forming a contact layer and a current blocking layer between the carrier and the light-emitting structure, wherein a material of the contact layer comprises Ag, and a material of the current blocking layer comprises $SiO_2$.

* * * * *